United States Patent [19]

Cetronio et al.

[11] Patent Number: 5,130,764
[45] Date of Patent: Jul. 14, 1992

[54] MULTI LAYER PHOTOPOLYMERIC STRUCTURE FOR THE MANUFACTURING OF MESFET DEVICES WITH SUBMICROMETRIC GATE AND VARIABLE LENGTH RECESSED CHANNEL

[75] Inventors: Antonio Cetronio, Monteporzio; Sergio Moretti; Vittoria Compagnucci, both of Rome, all of Italy

[73] Assignee: Selenia Industrie Elettroniche Associate, Italy

[21] Appl. No.: 376,963

[22] Filed: Jul. 6, 1989

Related U.S. Application Data

[63] Continuation of Ser. No. 13,654, Feb. 12, 1987, abandoned.

[30] Foreign Application Priority Data

Feb. 13, 1986 [IT] Italy .................. 47648 A/86

[51] Int. Cl.[5] ............................................ H01L 29/80
[52] U.S. Cl. ........................... 357/22; 430/314; 437/203
[58] Field of Search ............... 357/22 I, 22 J, 22 K, 357/22 S; 430/166, 273, 275, 314, 319; 437/203

[56] References Cited

U.S. PATENT DOCUMENTS

| | | | |
|---|---|---|---|
| 3,669,661 | 6/1972 | Page et al. ................... | 430/314 |
| 4,196,439 | 4/1980 | Niehaus et al. ................ | 357/15 X |
| 4,213,840 | 7/1980 | Omori et al. ................... | 357/22 I X |
| 4,256,816 | 3/1981 | Dunkleberger ................ | 430/314 X |
| 4,336,549 | 6/1982 | Ladd, Jr. ....................... | 357/22 K X |
| 4,533,624 | 8/1985 | Sheppard ....................... | 430/314 |
| 4,578,343 | 3/1986 | Kosemura et al. ............. | 430/314 X |
| 4,612,275 | 9/1986 | Gregor .......................... | 430/312 X |
| 4,618,510 | 10/1986 | Tan ................................ | 430/314 X |

Primary Examiner—Andrew J. James
Assistant Examiner—Sara W. Crane
Attorney, Agent, or Firm—Bryan, Cave, McPheeters & McRoberts

[57] ABSTRACT

A technique utilizing conventional photolithography to manufacture GaAs MESFET devices having submicrometric gate and variable length recessed channel. The structure of these devices consists of two photopolymeric layers separated by a metal interface. The upper, stencil layer sets the aperture of the submicrometric gate. The lower planarizing layer defines the recessed channel, through the metal interface, which acts as a template. The length of such channel may be varied through suitable choice of exposure time of the planarizing photopolymer. By adopting such multilayer structures it is possible to obtain gate lengths of ~b μm and recessed channel lengths form 0.8 to 3 μm, with a process yield typically better than 90%, simultaneously. Furthermore, by using a thicker planarizing layer in this structure it is possible to obtain a relatively thick metal deposit (typically about 0.8 μm), such as a Ti/Pt/Au overlayer over ohmic contacts and gate pads.

6 Claims, 3 Drawing Sheets

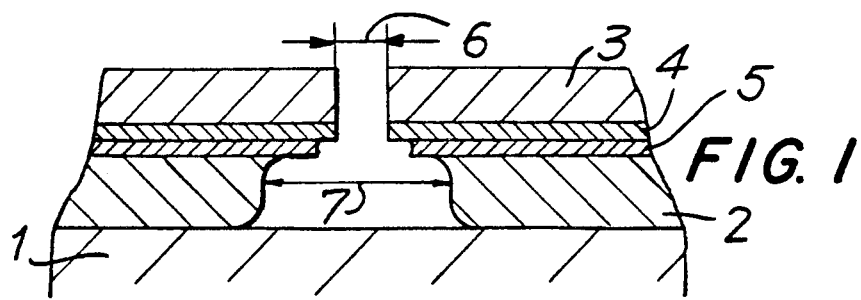
FIG. 1
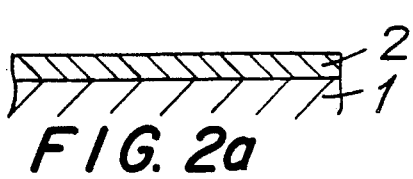
FIG. 2a
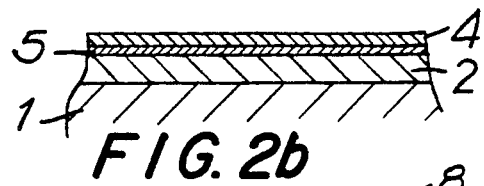
FIG. 2b
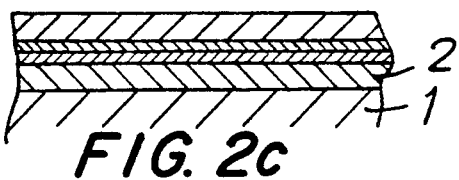
FIG. 2c
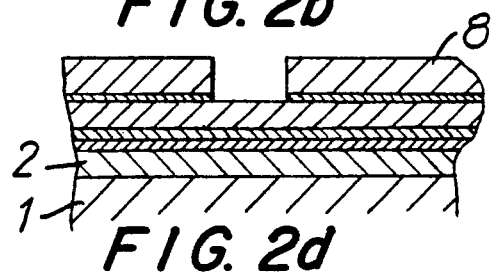
FIG. 2d
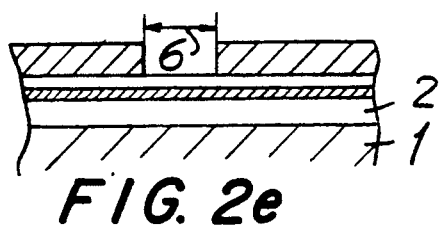
FIG. 2e
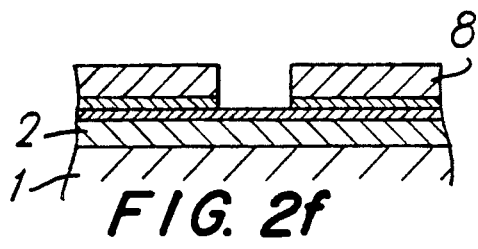
FIG. 2f
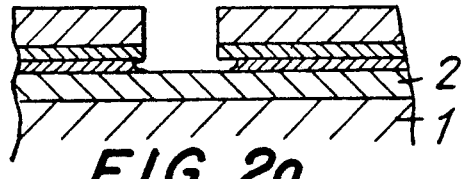
FIG. 2g
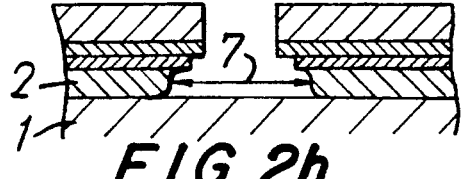
FIG. 2h
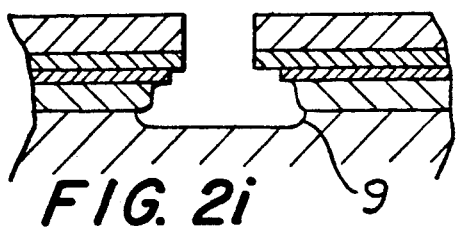
FIG. 2i
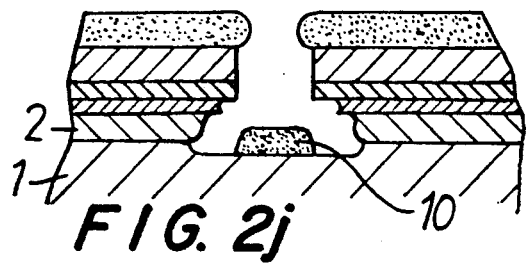
FIG. 2j
FIG. 2k-i
FIG. 2k-ii
FIG. 2k-iii

MULTI LAYER PHOTOPOLYMERIC STRUCTURE FOR THE MANUFACTURING OF MESFET DEVICES WITH SUBMICROMETRIC GATE AND VARIABLE LENGTH RECESSED CHANNEL

This application is a continuation of application Ser. No. 013,654, filed Feb. 12, 1987, now abandoned.

BACKGROUND OF THE INVENTION

With the progress in optical lithography in the submicrometric range, a number of methods which use two and three layer photopolymers have been proposed to obtain structures having submicron dimensions. See K. Tsuji, M. Lasago and K. Kugimiya, IEE Trans. on Electron Devices, ED 31 (1984) 1981; and K. Tsuji, M. Lasogo and K. Kugimiya, 1983 VLSI Symp. VLSI Tech. Dig. Tech. Papers (1983) 78. Such multilayer systems (MLRs), in the main, consist of a planarizing layer on the irregular surface of the slice and a stencil layer to produce high resolution submicrometric structures. These layers are used to solve the problem of reduced depth of field, inherent in high resolution optical projection systems.

SUMMARY OF THE INVENTION

Although this invention utilizes the concept of planarizing and stencil layers, it differs from other structures reported to date in the fact that the two photopolymer layers are separated by a thin metal interface, by virtue of which it is possible to treat the two layers separately while manufacturing the structure, so that the outline of the submicrometric gate and the recessed channel are almost identical. For an example, the stencil layer, which is usually very thin (typically 0.5 $\mu$m) requires exposure and development times which differ from those required by the planarizing layer, which is usually over-exposed and which may at times be much thicker (such as ~1.5 $\mu$m). The thin metal interface consists of a thin Au layer deposited over an Al layer. The Au layer, which can be readily etched through ion milling or RF sputtering, is used to produce a high definition submicrometric structure through a stencil resist technique, while the Al layer is used simply to prevent the plasma (which appears during Au etching) from damaging or hardening the planarizing layer below. Since the gate structure is delineated by the Au film, the later removal of the Al is less critical and, as such, simple wet etching may be adopted to unveil the planarization photopolymer. Clearly the exposure time of this lower photopolymer layer determines the amount of under-cut which takes place during the development phase, and as such it is possible to directly control the MESFET's recessed channel length.

This MLR structure is also used for relatively thick metal or non-metal film deposition using the "lift off" technique, for example, for overlaid deposits of Ti/Pt/Au in MESFET devices which are typically 0.8 $\mu$m thick. The thickness of the two photopolymer layers is suitably varied for this purpose, as discussed below.

The invention will be described below with reference to an MLR structure used to manufacture submicrometric gate and variable length, recessed channel MESFETs. This embodiment is described by way of illustration only. An alternative embodiment, utilizing metal or non-metal thick film deposition through a lift-off technique, is also described.

BRIEF DESCRIPTION OF THE DRAWINGS

FIG. 1: Diagram showing the characteristics of the MLR structure in accordance with the present invention;

FIG. 2: (a-h) Assembling the MLR structure; (i-j) Forming the recessed channel and the submicrometric gate deposition; (k (i,ii,iii)) different Lg ratios: Lrcs obtainable through the MLR structure;

DETAILED DESCRIPTION OF THE PREFERRED EMBODIMENTS

Figure 3A:
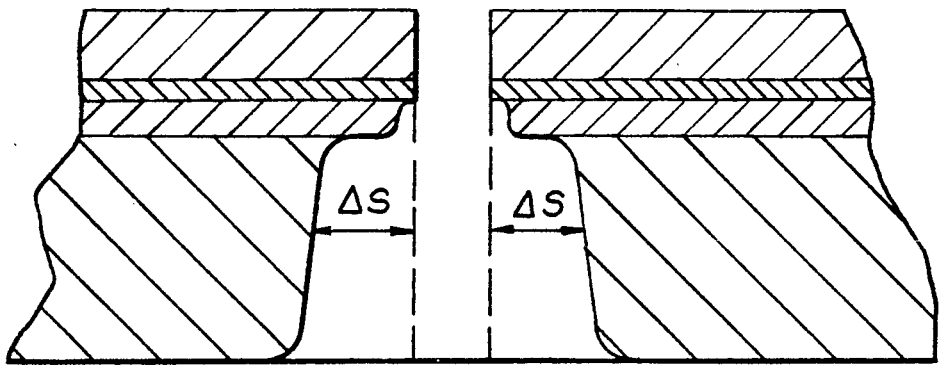
FIGS. 3a and 3b: Diagram of the extent of under-cut of the AS planarizing layer as a function of photopolymer exposure time.

The main characteristics of an MLR structure, delineated using a suitable template, are shown in FIG. 1. This schematic drawing of the invention shows the sublayer 1 (substrate) over which the structure is formed, the planarizing photopolymer layer 2, the stencil photopolymer layer 3, Au thin film layer 4 and the Al thin film layer 5. The two main features of such structure, the aperture 6 and the etched area 7 are formed by appropriately controlling exposure and development of the two photopolymers 2 and 3 in question, and by suitable etching conditions for the two thin metal films 4 and 5.

Details of the steps required to obtain the MLR structure shown in FIG. 1 will now be presented with reference to the schematic drawings shown in FIG. 2.

As shown in FIG. 2a, the first phase is that of spreading the planarizing photopolymer 2 over sublayer 1 (substrate).

By definition, the planarizing layer ought to be as thick as possible; however for the case in question, i.e. that of a submicrometric gate with variable length recessed channel, that layer is preferably thin so that the final length of the gate does not vary dimensionally from that of the aperture 6 through which it is deposited. For this phase a photopolymer such as AZ1450B by Shipley has been used, which is spread at 6000 gpm and provides a film ~0,3 $\mu$m thick. Then, following 90° C. baking for 30 minutes the two thin metal films are deposited, as shown in FIG. 2b. The Al film 5 and the Au film 4, both about 0.1 $\mu$m thick, are deposited under ultra high vacuum conditions to ensure good film quality and, in particular, good adherence between the Al film and the planarizing photopolymer. As shown in FIG. 2c, in the final phase of MLR structure preparation the stencil photopolymer 3 is spread over the existing layers and then the entire structure is baked again at 90° C. for 30 minutes. By definition, the stencil layer should be as thin as possible to provide the best resolution when used as a template. For example, photopolymer AZ1450B by Shipley spread at about 2000 gpm provides a 0.5 $\mu$m stencil layer.

Figure 3B:
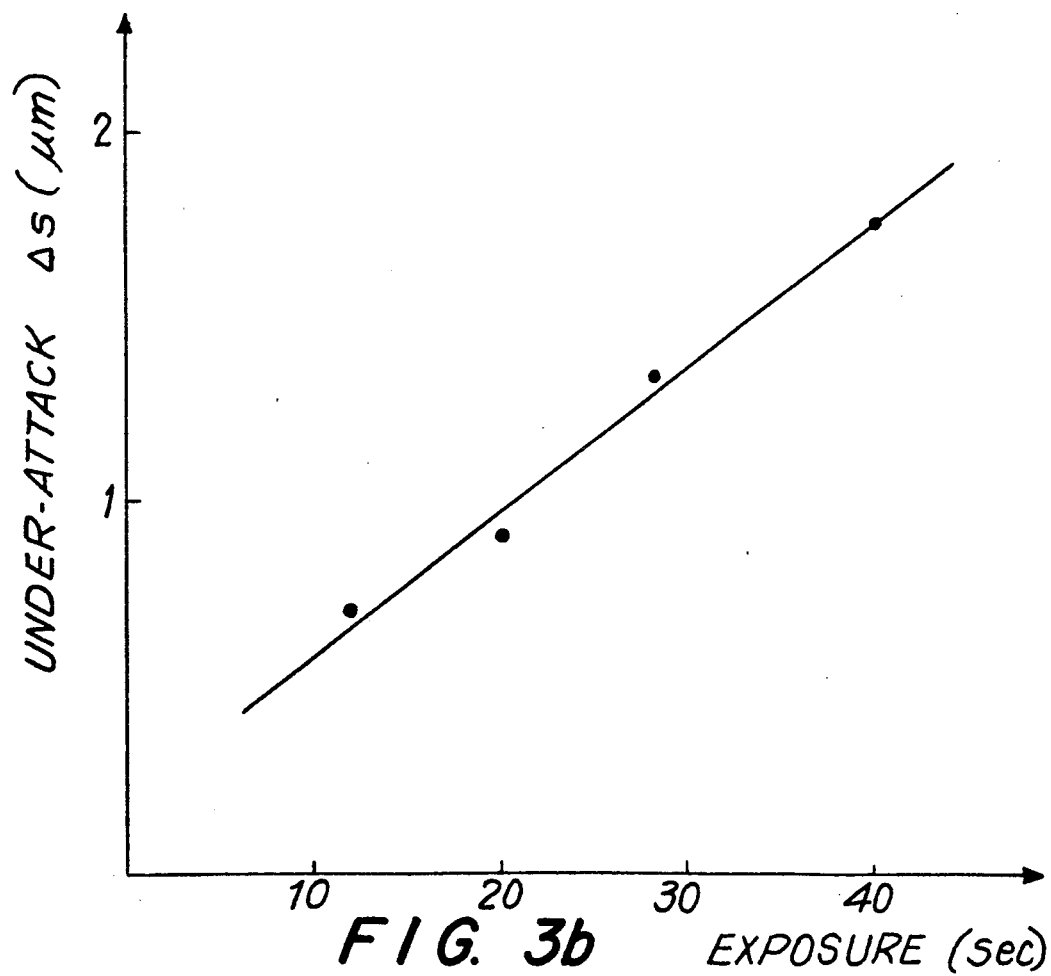

The main steps required to outline the MLR structure shown in FIG. 1, in which aperture 6 is the submicrometric gate and undercut 7 is the recessed channel, are the following:

a) Exposure of the stencil layer through a template 8 (FIG. 2d), followed by development to define aperture 6 of the submicrometric gate (as shown in FIG. 2e);

b) Using the stencil layer as a template, the Au film is etched by ion milling or RF sputtering (FIG. 2f). The etching conditions should damage the stencil layer to the least extent possible and should avoid Au redeposition on the sides of the photopolymer itself. Erosion in low pressure plasma (typically Ar at $1 \times 10^{-4}$ torr) satisfies such conditions. Since the differential between Au and Al etching speeds is very high using Ar, determining the end point of Au etching is not too critical. The duration of the process is determined by the time required to harden the photopolymer stencil layer so that it becomes insensitive to further light exposures.

c) Using the stencil layer and the Au film as a template, the Al film is attacked by a solution of 30% $H_3PO_4$ in deionized water at 50° C. Since the gate aperture is defined by the Au film, this phase is not too critical and as shown in FIG. 2g, a limited amount of undercut is normally accepted.

d) Using the stencil layer and the Au film as a template, the planarizing layer is exposed and developed to achieve a final structure as shown in FIG. 2h. As shown in FIG. 3, the extent of the undercut of the planarizing layer ($\Delta s$) is almost proportional to the photopolymer exposure time. As the length of the recessed channel $L_{rc} = L_g + 2 \Delta s$, undercut 7 may be varied easily through predetermined exposures of the photopolymer.

As shown in FIG. 2h, hardening by radiation of the stencil layer protects it from possible damage due to the exposure and development of the planarizing layer.

e) With the whole MLR structure as a template, the recessed channel 9 (FIG. 2i) is cut in the GaAs substrate using a suitable wet etching agent (such as $H_2O_2 + NH_4OH + H_2O$).

f) Using the whole MLR structure as a template, gate 10 is deposited through evaporation or sputtering as shown in FIG. 2j.

g) Removal of the whole MLR structure, using acetone for the lift-off, leaves the submicrometric gate and the recessed channel on the GaAs substrate as expected. FIGS. 2k (i, ii, iii) show configurations having different values of $L_g/L_{rc}$. Device (i) is more suitable for low noise MESFETs, while device (iii) is best suited for power MESFETs.

This invention pertains to a technique which adopts conventional photolithography to obtain submicrometric gate and variable length recessed channel MESFET devices. The technique uses an MLR structure having two layers of photopolymer separated by a very thin metal interface. The upper photopolymer, called the stencil layer, is used to define the submicrometric gate, while the photopolymer layer in contact with the substrate, called the planarizing layer, is used to delineate the length of the recessed channel. The length of the latter can be set and varied accurately through suitable selection of planarizing layer exposure times.

Figure 4A:
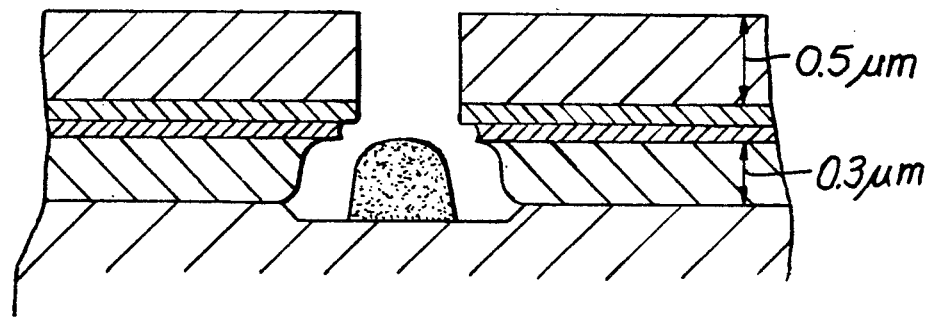
FIGS. 4a and 4b: MLR structure for: (a) recessed channel gate; (b) over-layer thick metallization.
Figure 4B:
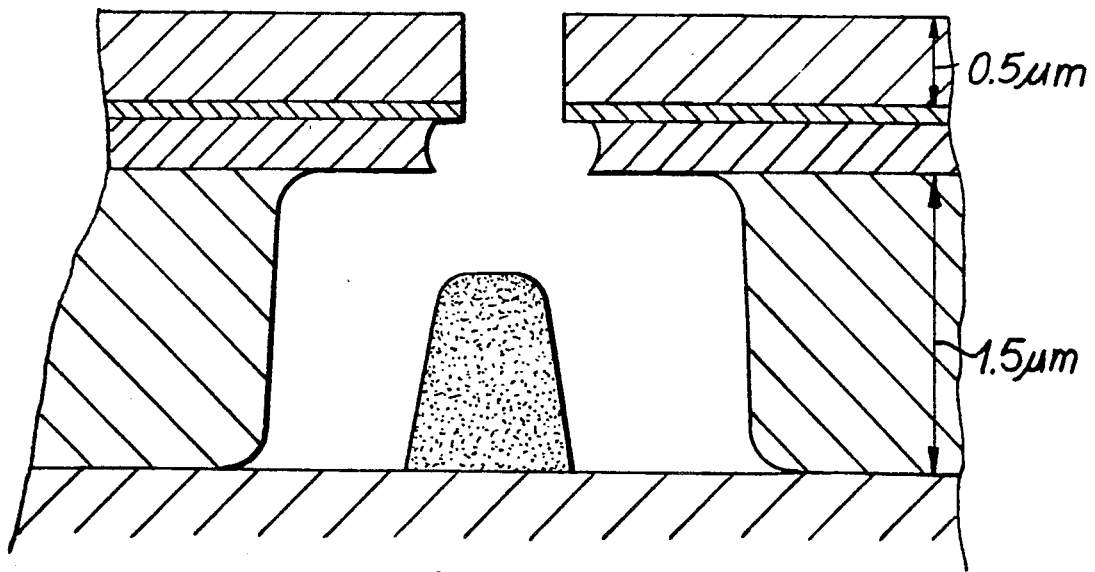

Using a multilayer structure, such as that shown in FIG. 4a, a gate length of about 0,5 μm and channel length between ~0.8 and 3 μm can be obtained simultaneously. Furthermore, using a thicker planarization layer, such as that shown in FIG. 4b, the same structure can be used to deposit relatively thick metal films (typically 0.8 μm) using the lift-off technique, such as a deposit of Ti/Pt/Au overlaid on the MESFET ohmic contacts.

References

1. K. Tsuji, M. Lasago and K. Kugimiya, IEEE Trans. on Electron Devices, ED 31 (1984) 1861.
2. J. M. Morgan and D. Maydan, J. Vac. Sci. Tech. 16 (1979) 1620.
3. M. M. O. Toole, E. D. Liu and M. S. Chang, Proc. SPIE, 275 (1981) 128.
4. B. J. Lin, Proc. SPIE, 174 (1979) 114.
5. K. Tsuji, M. Lasago and K. Kugimiya, 1983 VLSI Symp. VLSI Tech. Dig. Tech. Papers (1983) 78.

We claim:

1. In a multilayer photopolymeric structure for preparing a multilayer resist system (MLR) for the manufacture of a MESFET device incorporating a submicrometric gate and a recessed channel, comprising a substrate, a planarizing photopolymer layer on the substrate, a thin metal film layer for defining the submicrometric structure on the planarizing layer, and a stencil photopolymer layer overlying the film layer, the improvement comprising:

a planarizing layer that is unexposed to light prior to deposition of the other layers of the MLR; and
    a second thin metal film layer interposed between the planarizing layer and the structure-defining thin metal film layer, the second thin metal film layer having etching characteristics so differing from those of the structure-defining thin metal film layer that the structure-defining thin metal film may be etched to produce the desired high-definition submicrometric structure without etching the second thin metal film layer or damaging or hardening the planarizing photopolymer.

2. The multilayer photopolymeric structure of claim 1, wherein the second thin metal film layer is firmly adherent to the planarizing layer.

3. The multilayer photopolymeric structure of claim 1, wherein the substrate is constituted of gallium arsenide, the structure-defining thin metal film layer is constituted of gold, and the second thin metal film layer is constituted of aluminum.

4. A multilayered resist (MLR) structure for the manufacture of a MESFET device incorporating a submicrometric gate and a recessed channel, prepared by a method comprising the steps of:

(a) exposing the stencil photopolymer layer of the multilayer photopolymeric structure of claim 1 to light through a template to selectively harden the photopolymer, the thus hardened photopolymer being insensitive to subsequent exposure to light;
    (b) developing the stencil layer;
    (c) selectively etching the thin metal film layer, using the developed stencil layer as a template, to define the aperture of the submicrometric gate of the MESFET in said thin metal film layer, without etching any of said second thin metal film layer;
    (d) selectively etching the second thin metal film layer, using the developed stencil layer and the etched thin metal film layer as a template, under conditions permitting a limited amount of undercutting of the second thin metal film layer;
    (e) exposing the planarizing photopolymer layer to light, using the stencil layer and the second thin metal film layer as a template; and
    (f) developing the planarizing photopolymer layer, the planarizing layer being undercut in relation to the degree of its exposure in step (e), and the extent of the undercut determining the dimensions of the recessed channel of the MESFET, thereby producing the MLR.

5. The MLR structure of claim 4, wherein the second thin metal film layer of said multilayer polymeric structure is firmly adherent to the planarizing surface thereof.

6. The MLR structure of claim 4, wherein the substrate of said multilayer photopolymeric structure is constituted of gallium arsenide, the structure-defining thin metal film layer thereof is constituted of gold, and the second thin metal film layer thereof is constituted of aluminum.

* * * * *